US009947747B2

(12) United States Patent
Cheng et al.

(10) Patent No.: US 9,947,747 B2
(45) Date of Patent: Apr. 17, 2018

(54) FULLY DEPLETED SILICON-ON-INSULATOR DEVICE FORMATION

(71) Applicant: International Business Machines Corporation, Armonk, NY (US)

(72) Inventors: Kangguo Cheng, Schenectady, NY (US); Shawn P. Fetterolf, Grenoble (FR); Ahmet S. Ozcan, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/065,946

(22) Filed: Mar. 10, 2016

(65) Prior Publication Data

US 2016/0372594 A1    Dec. 22, 2016

Related U.S. Application Data

(62) Division of application No. 14/745,628, filed on Jun. 22, 2015.

(51) Int. Cl.
*H01L 29/78* (2006.01)
*H01L 29/76* (2006.01)
(Continued)

(52) U.S. Cl.
CPC ...... *H01L 29/1037* (2013.01); *H01L 29/0649* (2013.01); *H01L 29/0847* (2013.01);
(Continued)

(58) Field of Classification Search
CPC ........... H01L 29/1037; H01L 29/78684; H01L 29/0847; H01L 29/7838; H01L 29/0649;
(Continued)

(56) References Cited

U.S. PATENT DOCUMENTS 9,023,713 B2    5/2015    Illgen et al.
9,269,804 B2    2/2016    Asenov
(Continued)

OTHER PUBLICATIONS

List of IBM Patents or Patent Applications Treated as Related; (Appendix P), Filed Mar. 10, 2016; 2 pages.
(Continued)

*Primary Examiner* — Natalia Gondarenko
(74) *Attorney, Agent, or Firm* — Cantor Colburn LLP; Steven Meyers

(57) ABSTRACT

A p-type metal-oxide-semiconductor (pMOS) planar fully depleted silicon-on-insulator (FDSOI) device and a method of fabricating the pMOS FDSOI are described. The method includes processing a silicon germanium (SiGe) layer disposed on an insulator layer to form gaps on a surface opposite a surface that is disposed on the insulator layer, each of the gaps extending into the SiGe layer to a depth less than or equal to a thickness of the SiGe layer, and forming a gate conductor over a region of the SiGe layer corresponding to a channel region of the pMOS. The method also includes performing an epitaxial process on the SiGe layer at locations corresponding to source and drain regions of the pMOS planar FDSOI device.

7 Claims, 18 Drawing Sheets

(51) Int. Cl.
*H01L 29/10* (2006.01)
*H01L 29/06* (2006.01)
*H01L 29/161* (2006.01)
*H01L 29/66* (2006.01)
*H01L 29/08* (2006.01)
*H01L 29/786* (2006.01)
*H01L 29/423* (2006.01)
*H01L 21/00* (2006.01)

(52) U.S. Cl.
CPC ...... *H01L 29/161* (2013.01); *H01L 29/42384* (2013.01); *H01L 29/66477* (2013.01); *H01L 29/66628* (2013.01); *H01L 29/66742* (2013.01); *H01L 29/66787* (2013.01); *H01L 29/7838* (2013.01); *H01L 29/78684* (2013.01); *H01L 29/78696* (2013.01); *H01L 29/785* (2013.01)

(58) Field of Classification Search
CPC ............. H01L 29/66477; H01L 29/161; H01L 27/0922; H01L 27/12; H01L 27/1203; H01L 21/20; H01L 21/336; H01L 21/845; H01L 21/02532; H01L 21/76; H01L 21/761; H01L 21/76264; H01L 21/8238; H01L 29/0684; H01L 29/41783; H01L 29/4916; H01L 29/518; H01L 29/778; H01L 29/785; H01L 29/786; H01L 29/78; H01L 29/7848; H01L 29/78696; H01L 29/66787; H01L 29/66795; H01L 27/0883; H01L 21/823418; H01L 21/823814; H01L 29/66742; H01L 29/66628; H01L 29/42384; H01L 21/02381; H01L 21/0245; H01L 21/8236

USPC .................................. 257/348, 347, 392, 408
See application file for complete search history.

(56) References Cited

U.S. PATENT DOCUMENTS

| | | | |
|---|---|---|---|
| 9,520,329 B2 | 12/2016 | Hook et al. | |
| 2007/0066023 A1* | 3/2007 | Thakur | H01L 29/165 438/300 |
| 2007/0254464 A1* | 11/2007 | Greene | H01L 29/458 438/581 |
| 2012/0032275 A1* | 2/2012 | Haran | H01L 21/28518 257/401 |
| 2013/0181263 A1* | 7/2013 | Cai | H01L 29/66795 257/288 |
| 2013/0214356 A1* | 8/2013 | Cheng | H01L 21/84 257/347 |
| 2014/0001561 A1* | 1/2014 | Cheng | H01L 21/823807 257/369 |
| 2015/0097241 A1* | 4/2015 | Rideau | H01L 29/66772 257/347 |

OTHER PUBLICATIONS

Kangguo Cheng et al., "Fully Depleted Silicon-on-Insulator Device Formation", U.S. Appl. No. 14/745,628, filed Jun. 22, 2015.
List of IBM Patents or Patent Applications Treated as Related; (Appendix P), Filed Oct. 31, 2017; 2 pages.
Kangguo Cheng et al., "Fully Depleted Silicon-On-Insulator Device Formation", U.S. Appl. No. 15/798,457, filed Oct. 31, 2017.

* cited by examiner

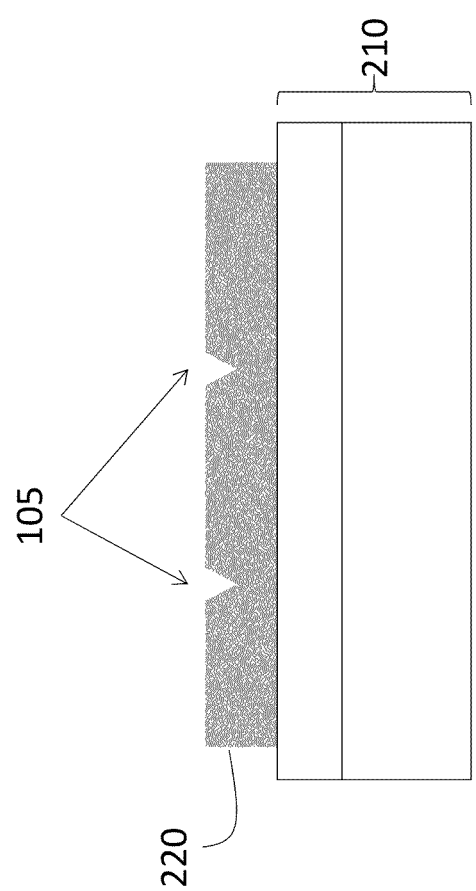

FULLY DEPLETED SILICON-ON-INSULATOR DEVICE FORMATION

This application is a division of U.S. application Ser. No. 14/745,628 filed Jun. 22, 2015, the disclosure of which is incorporated by reference herein in its entirety.

BACKGROUND

The present invention relates to a fully depleted silicon-on-insulator (FDSOI) device, and more specifically, to FDSOI device formation.

Planar FDSOI devices may be viewed as an alternative to fin field effect transistor (finFET) devices. A difference between FDSOI and finFET devices is that, in the FDSOI device, the active channel material may be very thin or extremely thin silicon on insulator (ETSOI) (e.g., 6-7 nanometers (nm) thickness for the silicon on a buried oxide insulator and bulk substrate). In a p-type metal-oxide-semiconductor (pMOS) channel, when the silicon layer is converted to silicon germanium (SiGe), an increase in the strain of the compressively strained SiGe increases majority carrier (hole) mobility, which increases performance. Conversely, an increase in the width of a SiGe active channel region decreases mobility, which decreases performance.

SUMMARY

According to one embodiment of the present invention, a method of fabricating a p-type metal-oxide-semiconductor (pMOS) planar fully depleted silicon-on-insulator (FDSOI) device includes processing a silicon germanium (SiGe) layer disposed on an insulator layer to form gaps on a surface opposite a surface that is disposed on the insulator layer, each of the gaps extending into the SiGe layer to a depth less than or equal to a thickness of the SiGe layer; forming a gate conductor over a region of the SiGe layer corresponding to a channel region of the pMOS; and performing an epitaxial process on the SiGe layer at locations corresponding to source and drain regions of the pMOS planar FDSOI device.

According to another embodiment, a p-type metal-oxide-semiconductor (pMOS) planar fully depleted silicon-on-insulator (FDSOI) device includes a base comprising a buried oxide layer formed on a bulk substrate; a silicon germanium (SiGe) layer formed on the base with gaps formed on a surface opposite a surface that is disposed on the base, each of the gaps extending into the SiGe layer to a depth less than or equal to a thickness of the SiGe layer; and a doped source-drain region epitaxially grown on a source-drain portion of the SiGe layer of the planar FDSOI device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-5 illustrate cross-sectional views of structures used in the formation of an FDSOI device according to an embodiment, in which:

FIG. 2 shows a compressed silicon germanium (cSiGe) layer formed on a buried oxide BOX (layer) of a silicon-on-insulator (SOI) substrate;

FIG. 3 shows the cSiGe layer formed into stripes with gaps therebetween;

FIG. 4 shows a gate structure formed on the BOX and substrate layers; and

FIG. 5 illustrates the active channel region of the device following epi merge according to an embodiment;

FIGS. 8-12 are cross sectional views illustrating the process of forming the cSiGe layer into stripes, as shown in FIG. 3, according to an embodiment, in which:

FIG. 8 shows the structure of FIG. 2 with dielectric walls defining a guide trench formed above the cSiGe layer;

FIG. 9 shows the result of filling the guide trench with a transfer layer of a DSA polymer;

FIG. 10 shows the result of selectively removing one domain of the DSA polymer;

FIG. 11 shows the structure that results from removing the dielectric walls; and FIG. 12 shows the result of etching the cSiGe layer by using the remaining domain of the DSA polymer as a mask;

FIGS. 13-17 are cross sectional views illustrating the process of forming the cSiGe layer into stripes, as shown in FIG. 3, according to another embodiment, in which:

FIG. 13 shows the structure of FIG. 2 with sacrificial mandrels formed above the cSiGe layer;

FIG. 14 shows spacers formed adjacent to the mandrels;

FIG. 15 shows the structure that results from filling open spaces between spacers with additional mandrel material;

FIG. 16 shows the spacers removed;

FIG. 17 shows the result of etching the cSiGe layer by using the mandrel material as a mask; and FIG. 18 illustrates a cross sectional view of an embodiment of the active pMOS with gaps formed therein.

DETAILED DESCRIPTION

As noted above, in an FDSOI device and, specifically, in a pMOS channel, increased width of the active channel area decreases the intrinsic performance for SiGe channels. The intrinsic device performance refers to the drive current normalized to the actual device width. Thus, a current approach to improve performance is to fabricate a narrow-width p-type field effect transistor (pFET). However, as channel width decreases, the drive current normalized to a given layout area undesirably decreases, as well. This is because the current flow region is reduced given that gaps between the adjacent narrow-width regions do not contribute to drive current. Embodiments of the devices and methods detailed herein relate to increasing strain and, thereby, mobility and performance of an FDSOI device by forming gaps in the channel silicon germanium (cSiGe) area.

Figure 1:
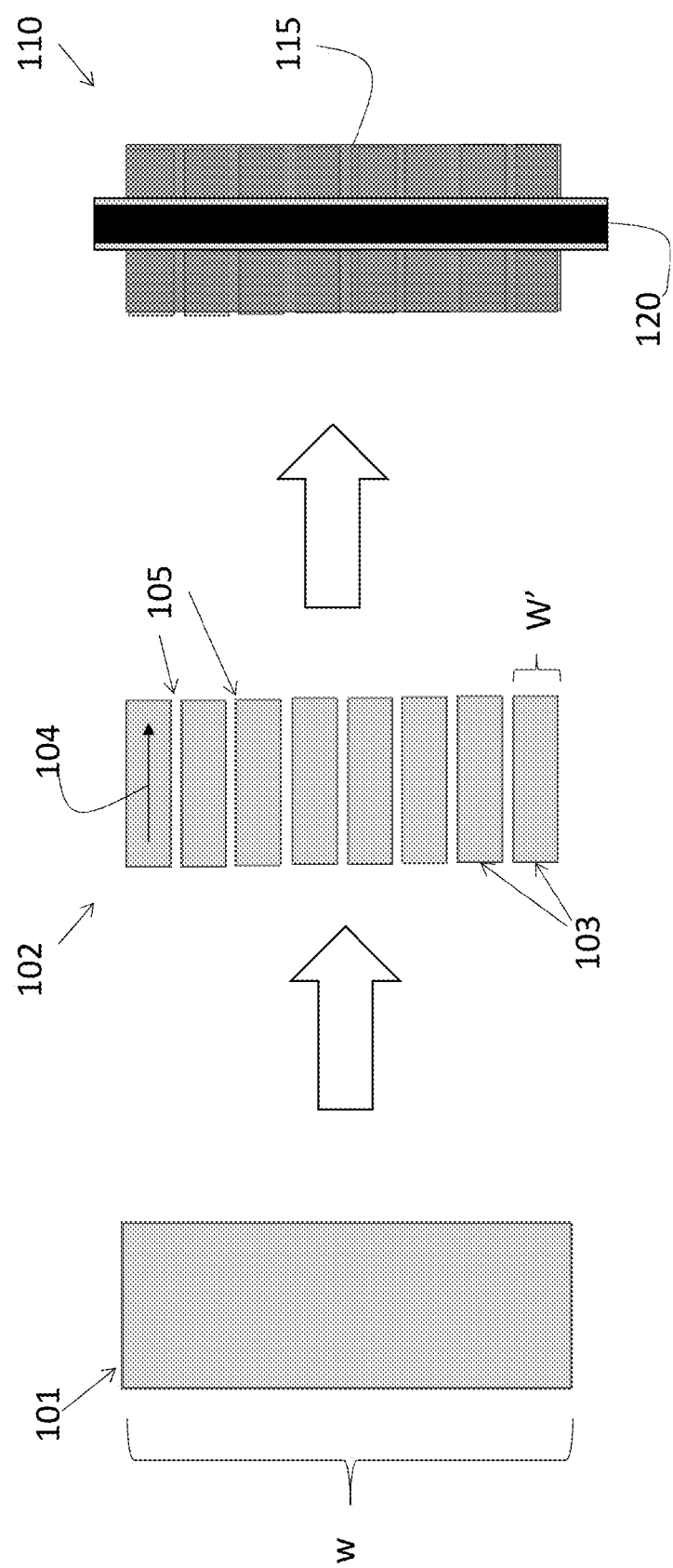
FIG. 1 is a sequence of top views that generally illustrate a fabrication process for performing source/drain epitaxial merging in FDSOI devices according to embodiments of the invention.

FIG. 1 shows a sequence of top views that generally illustrate a fabrication process for performing source/drain epitaxial merging in FDSOI devices according to embodiments of the invention. An active pMOS 101 is shown following cSiGe formation. The cSiGe formation is by epitaxial growth of the SiGe layer on a relaxed Si layer. The lattice mismatch resulting from larger Ge atoms trying to align with the smaller Si atoms causes the Ge atoms to be deposited closer to one another than normal. This results in compressive strain along the longitudinal axis. As noted above, this strain is related to mobility. The cSiGe results from a silicon-on-insulator (SOI) structure such that the cSiGe is formed on a buried oxide layer (BOX) above a substrate (collectively shown as layer 210, FIG. 2). The cSiGe has a width w. According to embodiments further detailed below, a striped pMOS 102 is formed from the pMOS 101. The striped pMOS 102 includes gaps 105 and may be formed using sidewall image transfer (SIT) or directed self-assembly (DSA), for example, as further discussed with reference to FIGS. 8-12 and FIGS. 13-17, respectively. The gaps may be on the order of 20 nanometers (nm) or less. The point of the striped pMOS 102 is that the width of each stripe 103 w' is much smaller than the width w of the (unstriped) pMOS 101. This decrease in width (from w to w') changes the strain from biaxial to uniaxial strain mainly along the channel region (along the direction 104). This is also the direction of current flow, and, as discussed above, changing strain from biaxial to uniaxial increases carrier mobility and, consequently, device performance. The final structure 110 shown in FIG. 1 is formed following epitaxial source-drain 115 merge and gate 120 formation and is shown in a cross-sectional view at FIG. 7. The gaps 105 are partially or fully filled by the merge of the epitaxially grown source-drain 115. This merge, which is facilitated by lateral epitaxial growth, lowers source-drain 115 resistance and improves drive current. The epitaxy is formed by in-situ boron doped (ISBD) SiGe epitaxy. Alternatively, undoped epitaxy may be used followed by ion implantation and dopant activation anneal to form the source-drain 115. In another alternate embodiment, the processes of ISBD epitaxy and ion implantation followed by anneal may be combined.

Figure 2:
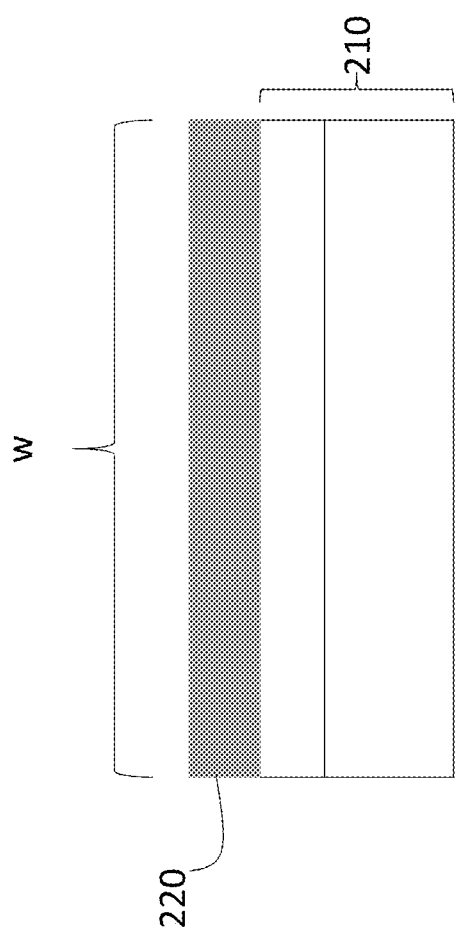
Figure 3:
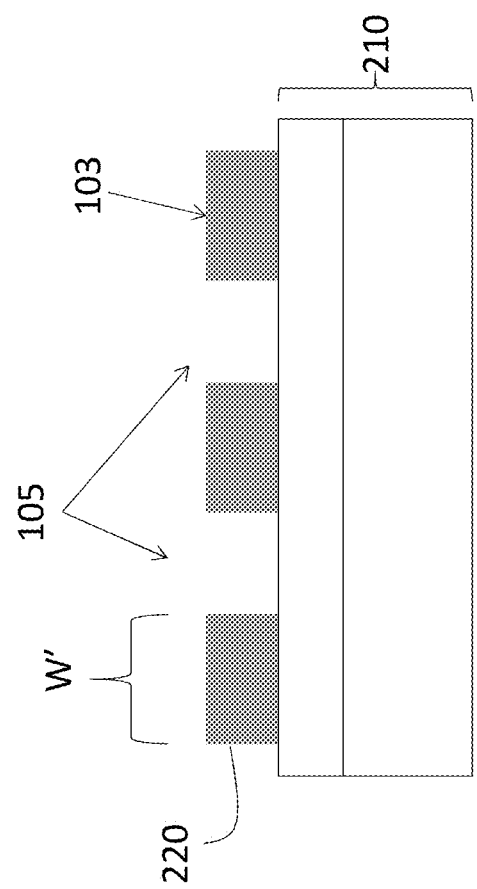
Figure 4:
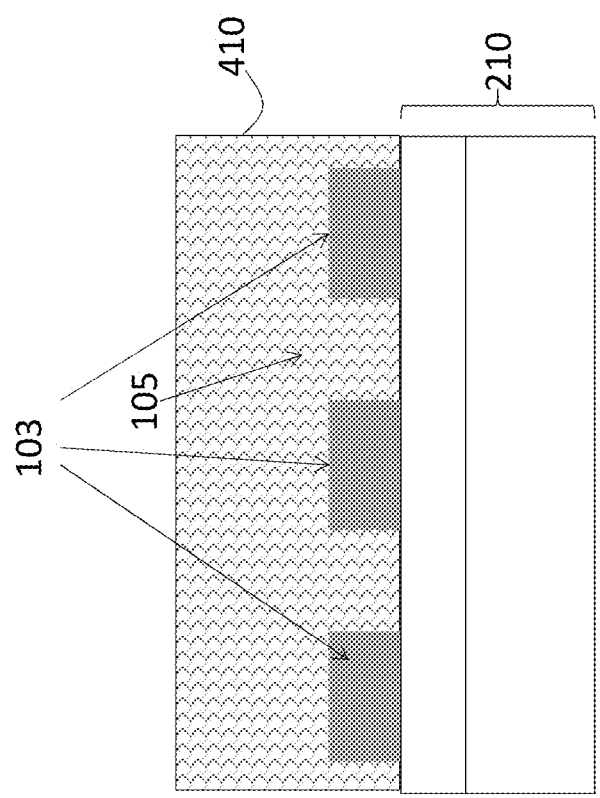

FIGS. 2-5 illustrate cross-sectional views of structures used in the formation of an FDSOI device according to an embodiment. The processes shown in FIGS. 2-4 are preceded by known processes of creating an active region on a substrate, defining the nMOS and pMOS areas and converting the Si to SiGe in the pMOS region through a condensation process, for example. FIGS. 2-5 pertain to the pMOS region. FIG. 2 shows a compressed silicon germanium (cSiGe) layer 220 formed on a buried oxide (BOX) (layer) of a silicon-on-insulator (SOI) substrate (labeled together as 210). As discussed with reference to FIG. 1, the SiGe layer 220 has a width of w. FIG. 3 shows the cSiGe layer 220 formed into stripes 103 with gaps 105 therebetween. Each stripe 103 has a width w'. The stripes 103 may be formed by lithographic techniques. Because the desired gap 105 size (e.g., 20 nm or less) may not be possible with standard lithography, a bigger gap may initially be formed and the smaller gap 105 may be achieved by growing back some SiGe epitaxially. In alternate embodiments, other known techniques may be used to form the stripes 103. For example, a SIT technique or DSA may be used as discussed below. Emerging technologies such as extreme ultraviolet (UV) lithography may also be used to form the stripes 103 in the near future. The stripes 103 may be formed only when the width w of the SiGe layer 220 meets a minimum threshold (e.g., 200 nm).

FIG. 4 shows a gate 410 formed on the BOX and substrate (210). The perspective of the cross section shown in FIG. 4 is such that the gate 410 is behind the stripes 103 and is formed between two sets of stripes 103 (as shown in FIG. 1, 110). Formation of the gate 410 is known and is not detailed herein. The gate 410 may be formed by a gate-first or a replacement gate process, both of which are known processes. Typically, the gate 410 includes a gate dielectric and a gate conductor. The gate dielectric may include silicon oxide ($SiO_2$), silicon nitride (SiN), silicon oxynitride (SiOxNy), boron nitride (BN), high-k materials, or any combination thereof. Exemplary high-k materials include metal oxides and dopants such as lanthanum or aluminum. The gate dielectric may be formed by any number of known processes including thermal or chemical oxidation, thermal nitridation, atomic layer deposition (ALD), electron beam deposition, laser assisted deposition, or a combination of the known processes. The gate conductor may include polycrystalline or amorphous silicon, germanium, silicon germanium, a metal (e.g., tungsten, titanium, platinum), or a conducting metallic compound material (e.g., tantalum nitride, titanium nitride), for example. Additionally, dopants may be incorporated during or after deposition. The gate conductor may be formed by ALD, another known process, or a combination of known processes.

Figure 5:
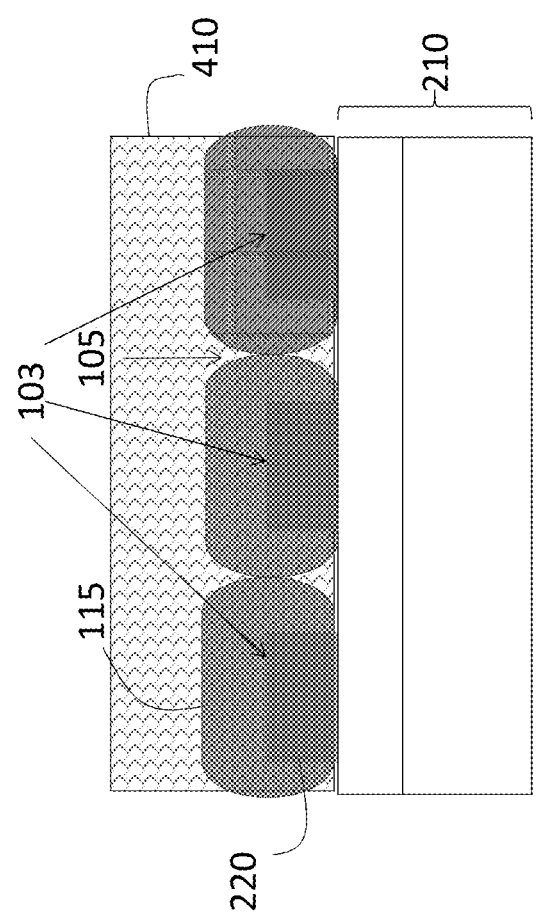

Following formation of the gate 410, selective epitaxial growth of the doped region or the source-drain 115 region according to one embodiment results in the structure shown in FIG. 5. According to the embodiment shown in FIG. 5, the gap 105 between the stripes 103 is partially filled by the epi-merger. As a result, current flow area is increased and, consequently, resistance is decreased.

Figure 6:
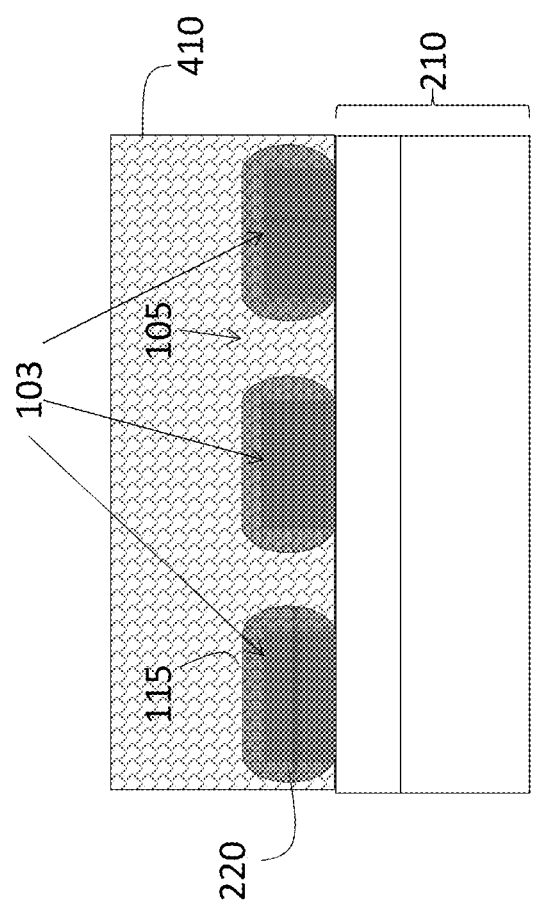
FIG. 6 illustrates the active channel region of the device following epi-merger according to another embodiment.
Figure 7:
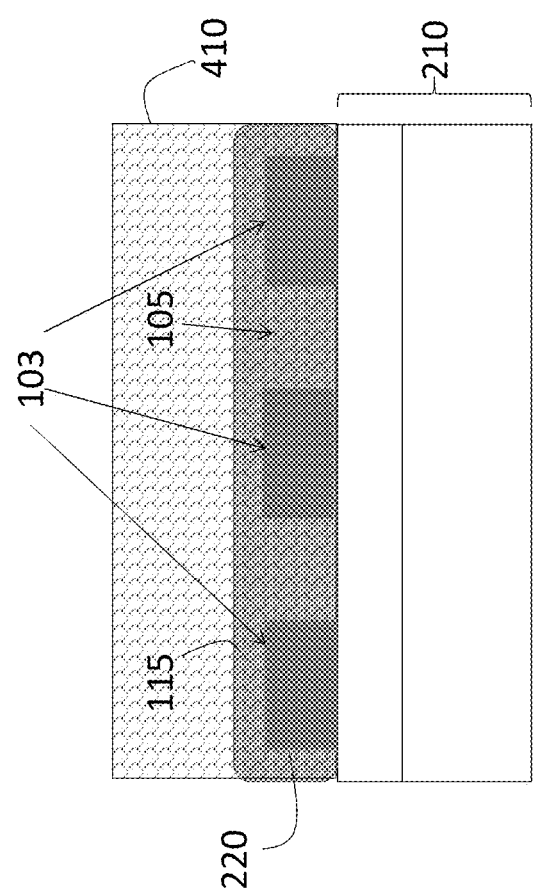
FIG. 7 illustrates the active channel region of the device following epi-merger according to yet another embodiment.

FIG. 6 shows an FDSOI structure according to another embodiment. In the current embodiment, the gap 105 between the stripes 103 is not filled by the epitaxial growth of the source-drain 115 region. FIG. 7 shows an FDSOI structure according to yet another embodiment. In the embodiment of FIG. 7, the gap 105 between the stripes 103 is entirely filled by the epitaxial growth. Based on the maximum gap 105 width (e.g., 20 nm), current flow is not inhibited even in the embodiment shown in FIG. 6. Comparatively, resistance is lowest (and current flow area largest) in the embodiment shown in FIG. 7.

Figure 8:
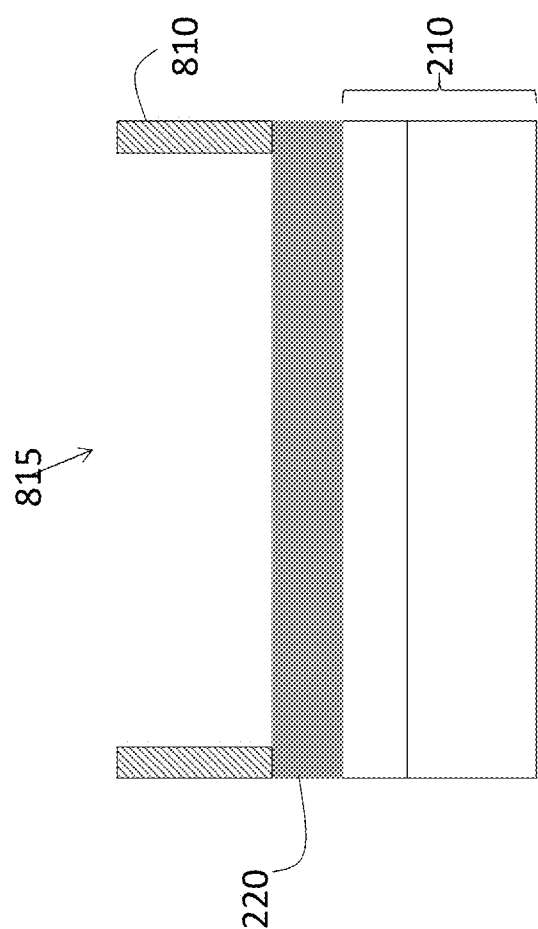
Figure 9:
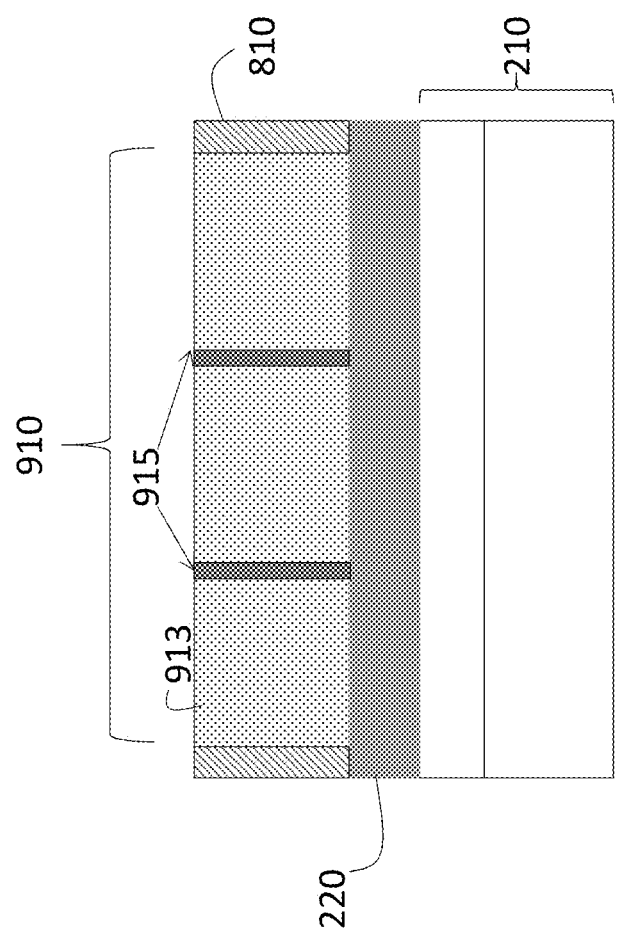
Figure 10:
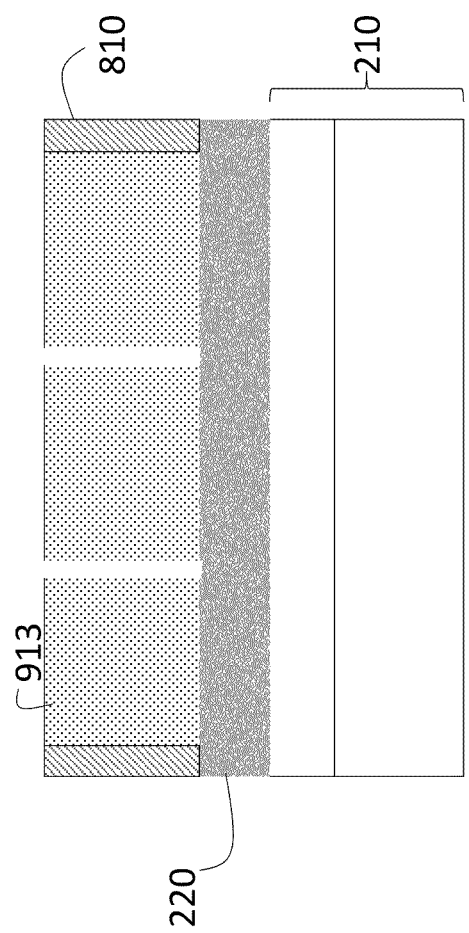
Figure 11:
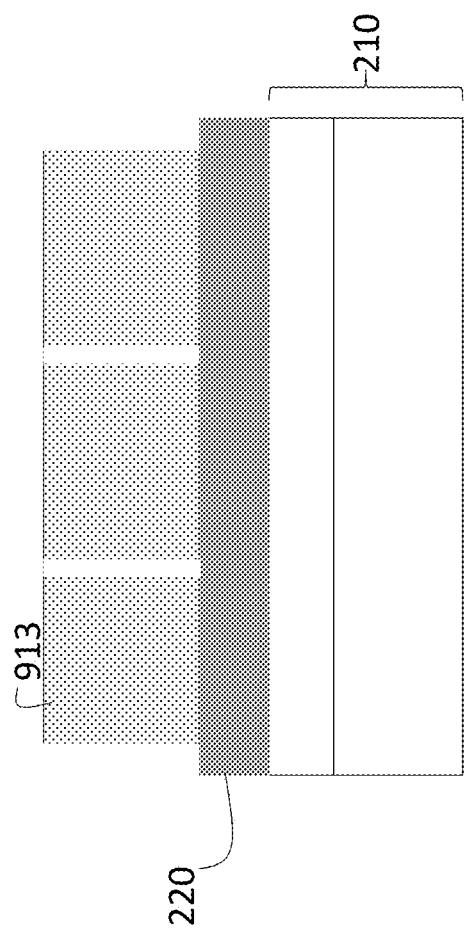
Figure 12:
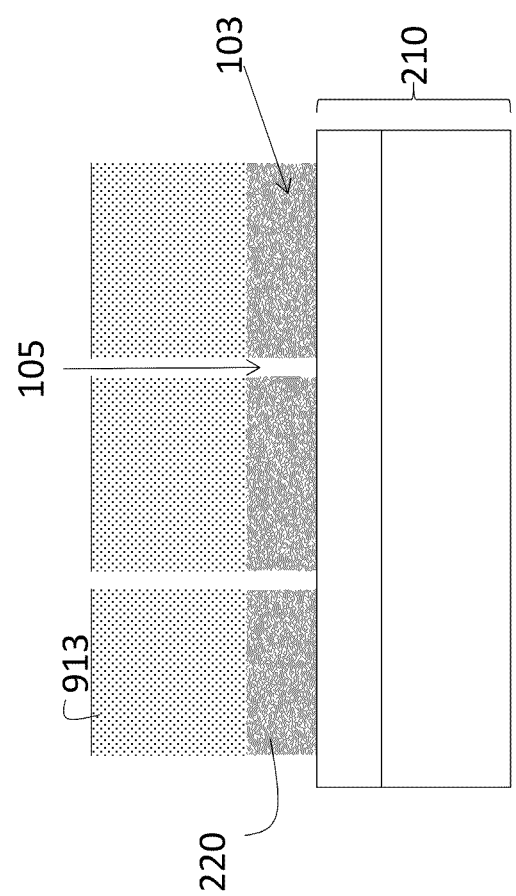

FIGS. 8-12 are cross sectional views illustrating the process of forming the cSiGe layer 220 into stripes 103, as shown in FIG. 3, according to an embodiment. The embodiment shown in FIGS. 8-12 pertains to DSA and begins with the structure shown in FIG. 2. FIG. 8 shows the structure of FIG. 2 with dielectric walls 810 defining a guide trench 815 formed above the cSiGe layer 220. The dielectric walls 810 may include nitride, for example. FIG. 9 shows the result of filling the guide trench 815 with a transfer layer of a DSA polymer 910 (e.g., spin-on-glass layer, spin-on carbon layer). The DSA polymer 910 or self-assembled material self-organizes to form domains 913, 915 to minimize the interfacial energy between the DSA polymer 910 and the cSiGe layer 220. Removing one domain 915 selective to the other domain 913 results in the structure shown in FIG. 10. The domain 915 may be removed by an ion-etch process, for example. The dielectric walls 810 are then removed to provide the structure shown in FIG. 11. Then, by using the domain 913 as a mask, the cSiGe layer 220 may be patterned to form the stripes 103 as shown in FIG. 12. Smaller gaps 105 may be achieved by using the DSA polymer 910 (the domain 913) as a mask rather than a lithographic mask, for example.

Figure 13:
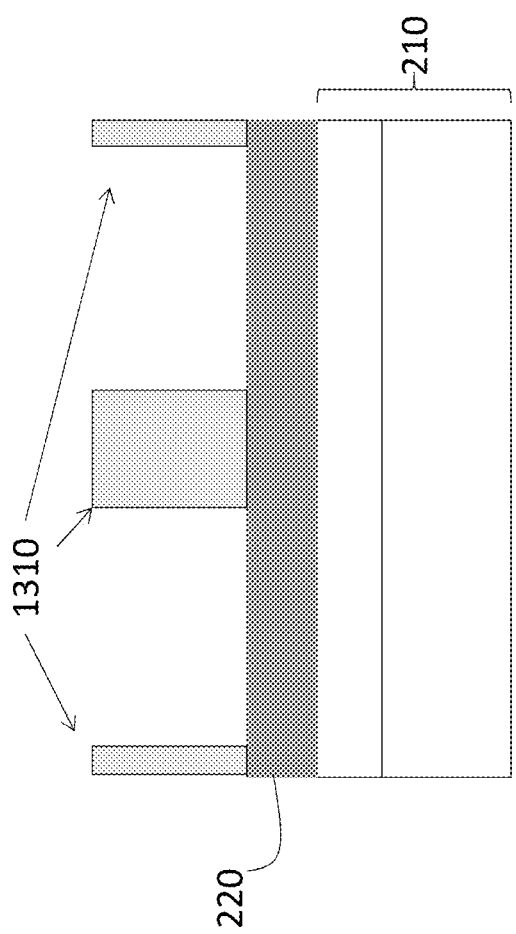
Figure 14:
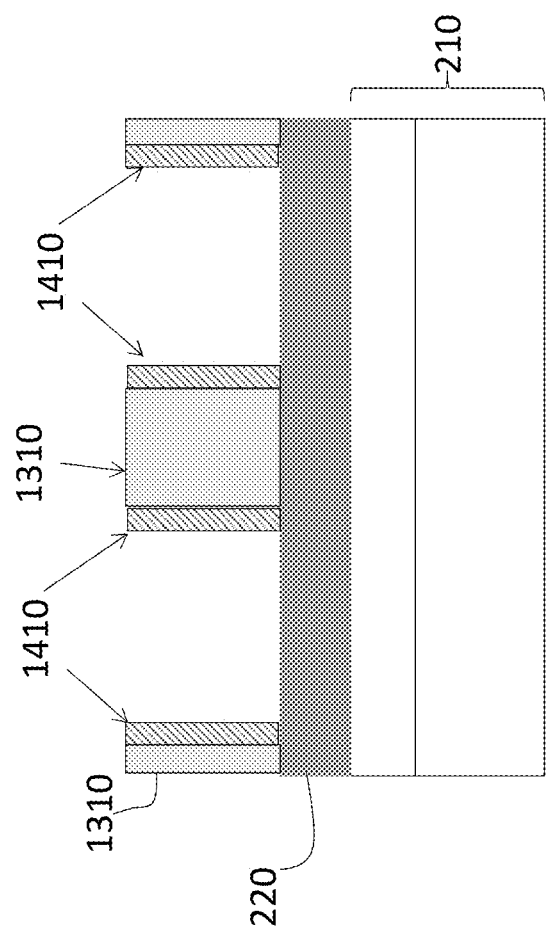
Figure 15:
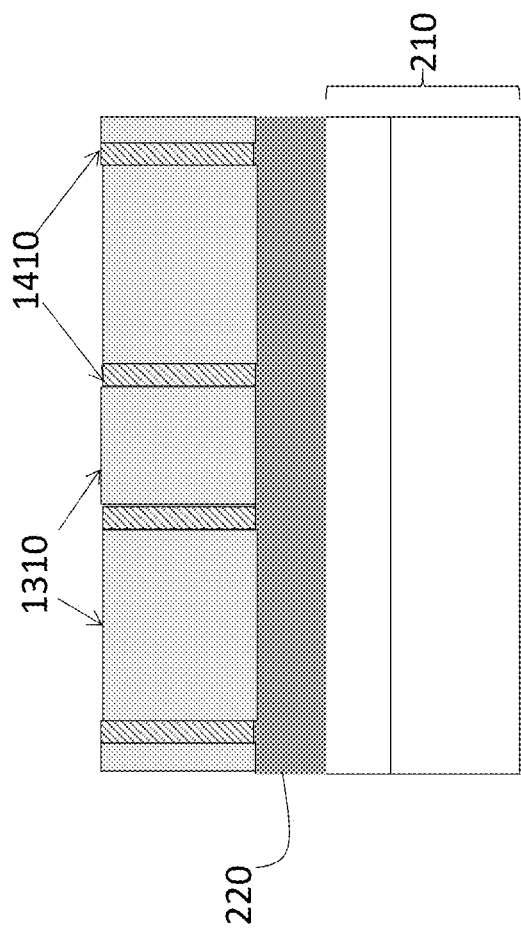
Figure 16:
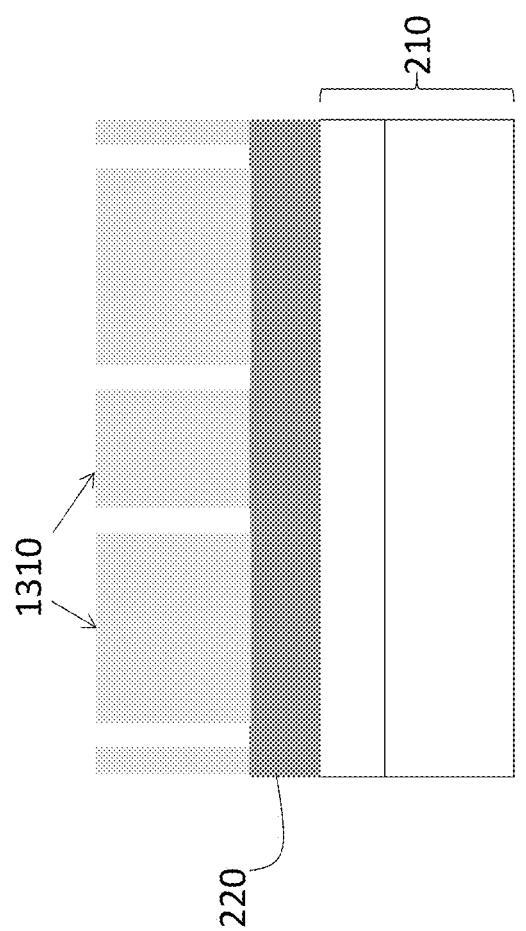
Figure 17:
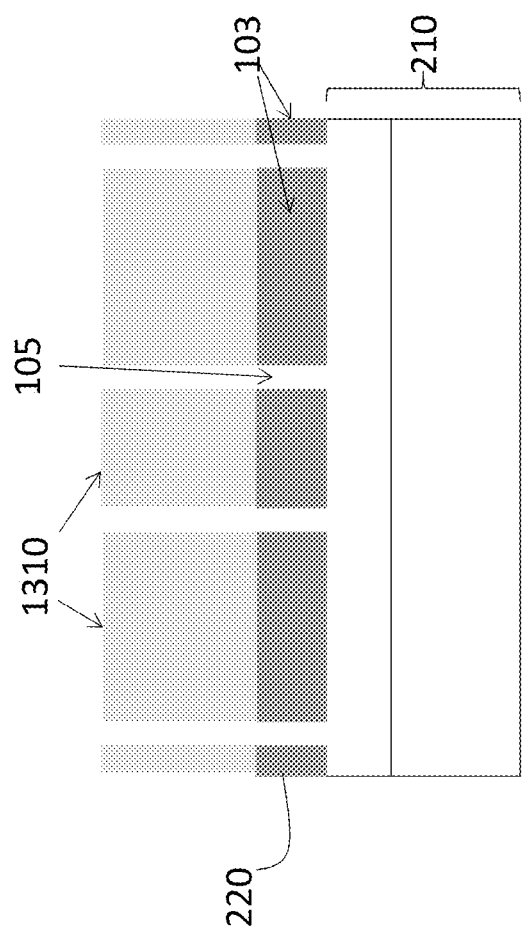

FIGS. 13-17 are cross sectional views illustrating the process of forming the cSiGe layer 220 into stripes 103, as shown in FIG. 3, according to another embodiment. The embodiment shown in FIGS. 13-17 relates to SIT and begins with the structure shown in FIG. 2. FIG. 13 shows the structure of FIG. 2 with sacrificial mandrels 1310 formed above the cSiGe layer 220. The mandrel 1310 may include amorphous carbon, for example. Spacers 1410 are formed adjacent to the mandrels 1310 to form the structure shown in FIG. 14. The spacers 1410 may be formed by known techniques and may include oxide, for example. FIG. 15 shows the structure that results from filling open spaces between the spacers 1410 with additional mandrel 1310 material (e.g., amorphous carbon). The spacers 1410 are removed to provide the structure shown in FIG. 16. Then, the mandrel 1310 material is used as a mask to etch the cSiGe layer 220 and form the stripes 103. As the steps shown in FIGS. 13-17 indicate, the width of the stripes 103 may be controlled by controlling the width of the mandrels 1310 and, thus, the placement of the spacers 1410 that result in the gaps 105.

FIG. 18 illustrates a cross sectional view of an embodiment of the active pMOS 101 with gaps 105 formed therein. While stripes 103 are specifically discussed and shown for explanatory purposes in the embodiments detailed above, the gaps 105 created within the cSiGe layer 220 need not go all the way through to the BOX layer (210) as shown by the current embodiment. The above-discussed embodiments for forming the gaps 105 apply to the current embodiment, as well. As in the embodiments discussed above, the formation of the gaps 105 shown in FIG. 18 is followed by gate 410 formation and epitaxial growth of the doped source-drain 115 region. As noted for the embodiments detailed above, the gaps 105 increase strain, thereby increasing mobility and, consequently, device performance.

The FDSOI devices discussed herein are planar devices and a brief differentiation from fin field effect transistor (finFET) devices is provided for explanatory purposes. In comparison to the (three-dimensional) finFET device, for example, the FDSOI is a planar process device. The aspect ratio (height:width) of the stripes 103 is lower than 1:2, while a fin is typically at least twice as high as it is wide (aspect ratio is 2:1 or higher). Width is the dimension parallel to the surface such that, in a fin FET device, channel length is given by a sum of width and twice the fin height (the surface length of the fin). As such, a taller fin increases channel length by a factor of 2. In the embodiments of the FDSOI devices discussed above, the height of the stripes 103 (which corresponds to the depth of the cSiGe layer 220) is less than the width (along 104 in FIG. 1). In a finFET device, the gate material surrounds the channel region, while the gate 410 is formed above the channel in the FDSOI device. Finally, while the source drain regions are wrapped to form the fin in a finFET device, the source-drain 115 region is epitaxially grown above and around the stripes 103 in the FDSOI device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A p-type metal-oxide-semiconductor (pMOS) planar fully depleted silicon-on-insulator (FDSOI) device, comprising:
    a base comprising a buried oxide layer formed on a bulk substrate;
    a silicon germanium (SiGe) layer formed on the base with gaps formed in the SiGe layer,
    each of the gaps extending into the SiGe layer to a depth equal to a thickness of the SiGe layer such that a surface of the buried oxide layer is exposed below the gaps;
    a gate formed within the gaps; and
    a doped epitaxial source-drain region on the SiGe layer of the planar FDSOI device, wherein the source-drain region does not cover all of the surface of the buried oxide layer below the gaps.

2. The device according to claim 1, wherein the SiGe layer has a thickness of 6-7 nanometers.

3. The device according to claim 1, wherein each of the gaps is 20 nanometers or less in width.

4. The device according to claim 1, wherein the source-drain region is outside the gaps.

5. The device according to claim 1, further comprising the gate formed over a channel portion of the SiGe layer.

6. The device according to claim 1, wherein the SiGe layer is formed as stripes with the gaps between the stripes extending to the depth equal to a thickness of the stripes.

7. The device according to claim 6, wherein an aspect ratio of the stripes is less than 2:1.

\* \* \* \* \*